(12) United States Patent
Kondo

(10) Patent No.: US 8,384,432 B2
(45) Date of Patent: Feb. 26, 2013

(54) SEMICONDUCTOR DEVICE AND INFORMATION PROCESSING SYSTEM INCLUDING THE SAME

(75) Inventor: Chikara Kondo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/923,832

(22) Filed: Oct. 8, 2010

(65) Prior Publication Data
US 2011/0089973 A1 Apr. 21, 2011

(30) Foreign Application Priority Data
Oct. 9, 2009 (JP) .................. 2009-235484

(51) Int. Cl.
*H01L 25/00* (2006.01)
*H03K 19/0175* (2006.01)
(52) U.S. Cl. ............... 326/82; 326/41; 326/47; 326/101
(58) Field of Classification Search ............. 326/37–41, 326/47, 101, 82–87
See application file for complete search history.

(56) References Cited

U.S. PATENT DOCUMENTS

| 7,345,505 | B2 * | 3/2008 | Madurawe ............... 326/38 |
| 7,808,276 | B2 * | 10/2010 | Ciccarelli et al. ......... 326/83 |
| 2007/0126105 | A1 | 6/2007 | Yamada et al. |
| 2009/0085608 | A1 * | 4/2009 | Alzheimer ............... 326/86 |
| 2009/0141827 | A1 * | 6/2009 | Saito et al. .............. 375/295 |
| 2010/0090338 | A1 * | 4/2010 | Lee et al. ................ 257/737 |
| 2010/0106919 | A1 * | 4/2010 | Manning ................. 711/154 |
| 2010/0193962 | A1 * | 8/2010 | Shibata et al. ............ 257/773 |

FOREIGN PATENT DOCUMENTS

| JP | 2000-137644 A | 5/2000 |
| JP | 2007-157266 A | 6/2007 |

* cited by examiner

*Primary Examiner* — Thienvu Tran
(74) *Attorney, Agent, or Firm* — McGinn IP Law Group, PLLC

(57) ABSTRACT

A semiconductor device includes a plurality of core chips and an interface chip stacked together. Each of the core chips and the interface chip includes plural through silicon vias that penetrate a semiconductor substrate and a bidirectional buffer circuit that drives the through silicon vias. The interface chip also includes a logic-level holding circuit that holds a logic level of the through silicon vias. The bidirectional buffer circuit includes an input buffer and an output buffer. The driving capability of a first inverter of the logic-level holding circuit is smaller than the driving capability of the output buffer of the bidirectional buffer circuit.

20 Claims, 11 Drawing Sheets

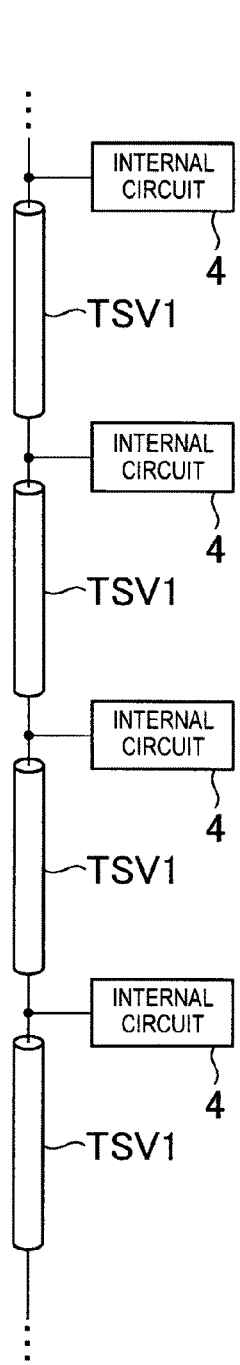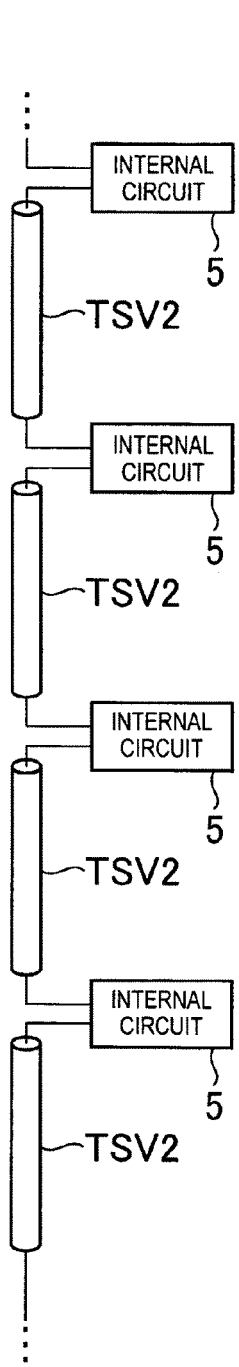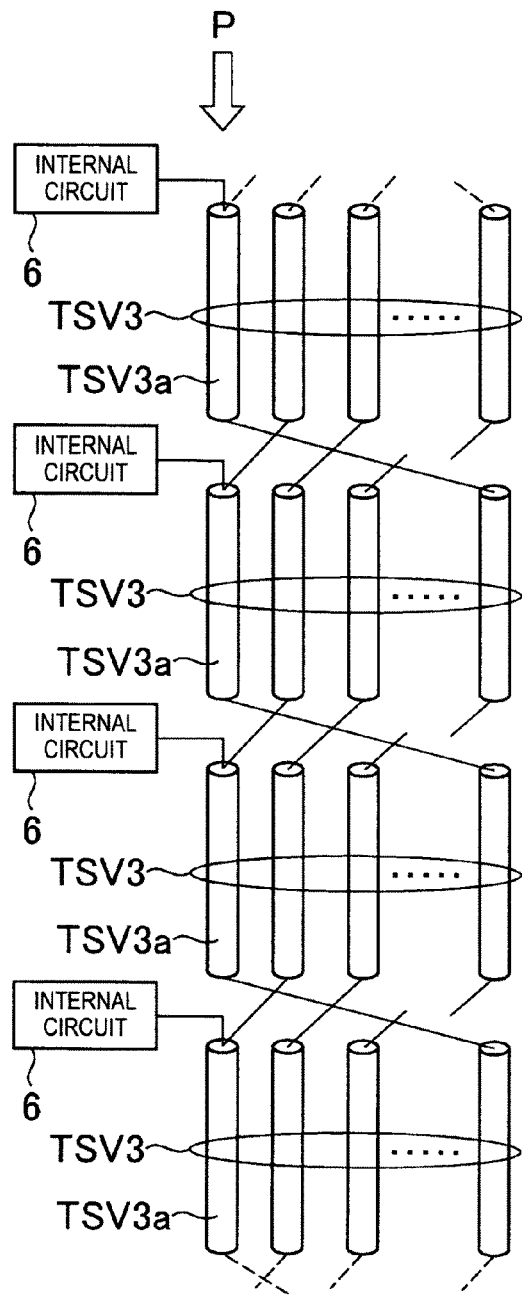
FIG.2A          FIG.2B                    FIG.2C

SEMICONDUCTOR DEVICE AND INFORMATION PROCESSING SYSTEM INCLUDING THE SAME

BACKGROUND OF THE INVENTION

1. Field of the Invention

The present invention relates to a semiconductor device and an information processing system including the same. More particularly, the present invention relates to a semiconductor device that includes plural core chips and an interface chip to control the cores and an information processing system including the same.

2. Description of the Related Art

A memory capacity that is required in a semiconductor device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit in individual chips and laminates these chips, thereby constituting one semiconductor device, is suggested (for example, Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor device that has a large memory capacity and a high operation speed as a whole.

JP-A No. 2007-157266 discloses a structure having DRAM chips stacked in five layers, having an interface chip stacked thereon, and having these chips connected to each other via a through silicon via (hereinafter, "TSV"). A stacked semiconductor device that exchanges internal data via the TSV needs to include a bidirectional buffer to drive the TSV having a large capacitance. Normally, a tri-state buffer capable of using an output in high impedance is used for this kind of bidirectional buffers (JP-A No. 2000-137644).

However, in a conventional chip-stacked semiconductor device having a bidirectional buffer connected to all TSVs of an interface chip and core chips, the logic level of the TSVs becomes unstable when output buffers in bidirectional buffers of all chips connected to one TSV are set at high impedance. As a result, a through current flows to an input buffer in the bidirectional buffers and the current consumption of the semiconductor device greatly increases.

Further, because any memory element is not mounted on the interface chip, the interface chip alone cannot test a read/write operation. Therefore, a defect of the interface chip is recognized after combining the interface chip with core chips. Accordingly, the entire semiconductor device including good core chips has to be discarded as a defective product. To solve this problem, there is a demand for a method of determining a defect of an interface chip at a wafer stage before stacking.

SUMMARY

In one embodiment, there is provided a semiconductor device comprising: a first semiconductor chip including at least an output buffer; a second semiconductor chip including at least an input buffer; a through silicon via that is provided to penetrate the first or second semiconductor chip and is connected to an output terminal of the output buffer and an input terminal of the input buffer; and a logic-level holding circuit that is provided in the first or second semiconductor chip and holds a logic level of the through silicon via.

In another embodiment, there is provided a manufacturing method of a semiconductor device according to the present invention, comprising: a step of manufacturing a plurality of core chips; a step of manufacturing an interface chip that controls the core chips; a step of performing an operation test of the core chips and the interface chip; and a step of manufacturing a stacked semiconductor device by having the core chips and the interface chip stacked together, wherein the step of manufacturing the interface chip includes a step of forming a plurality of through silicon vias that penetrate a substrate, a bidirectional buffer circuit that drives the through silicon vias, and a logic-level holding circuit that holds a logic level of the through silicon vias, and the step of performing an operation test of the interface chip includes a step of causing the logic-level holding circuit to hold data output from the bidirectional buffer circuit and a step of reading data held in the logic-level holding circuit from the bidirectional buffer circuit.

There is provided an information processing system according to the present invention, comprising: a semiconductor device having a plurality of core chips and an interface chip that controls the core chips; and a controller that controls the semiconductor device, wherein each of the core chips includes a plurality of through silicon vias that penetrate a substrate and a tri-state buffer having an output terminal thereof connected to the through silicon vias, and the interface chip includes an input buffer having an input terminal thereof connected to the through silicon vias and a logic-level holding circuit that holds a logic level of the through silicon vias.

According to the present invention, output buffers of all bidirectional buffer circuits connected to the through silicon via operate as termination resistors, and thus even when the output buffers are in high impedance, the logic level of the through silicon via can be maintained. Consequently, it is possible to prevent a logic unstable state of the through silicon via and to prevent an occurrence of a through current. Further, an operation test of an interface chip alone can be performed by using a logic-level holding circuit provided in the interface chip as a pseudo memory, and thus the manufacture yield semiconductor devices can be greatly improved.

BRIEF DESCRIPTION OF THE DRAWINGS

The above features and advantages of the present invention will be more apparent from the following description of certain preferred embodiments taken in conjunction with the accompanying drawings, in which:

FIGS. 2A to 2C are diagrams to explain the various types of TSV provided in a core chip;

DETAILED DESCRIPTION OF PREFERRED EMBODIMENTS

Preferred embodiments of the present invention will be explained below in detail with reference to the accompanying drawings.

Figure 1:
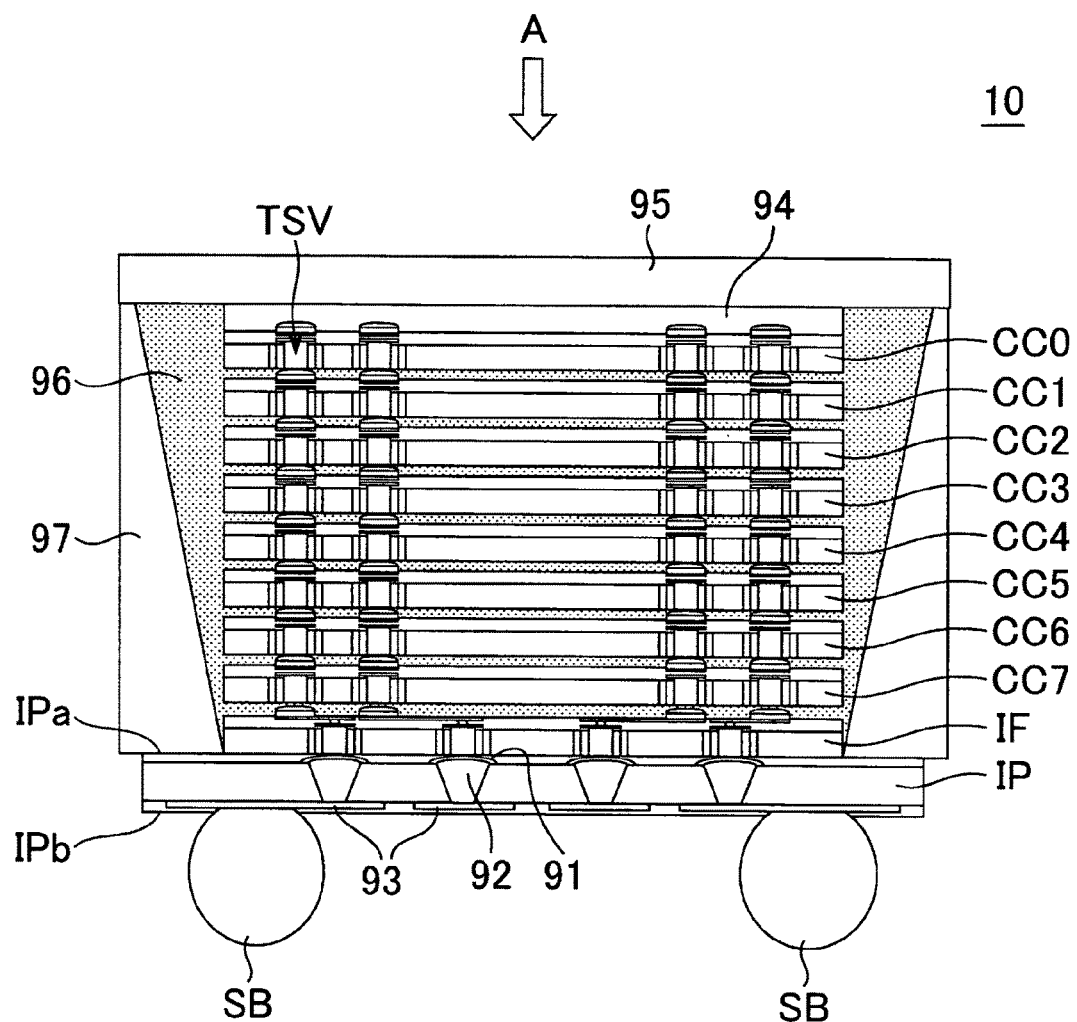
FIG. 1 is a schematic cross-sectional view illustrating the structure of a semiconductor device according to the preferred embodiment of the present invention.

FIG. 1 is a schematic cross-sectional view illustrating the structure of a semiconductor device according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits 4 in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Another TSV group is short-circuited from the TSVs of other layer provided at the different position in plan view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
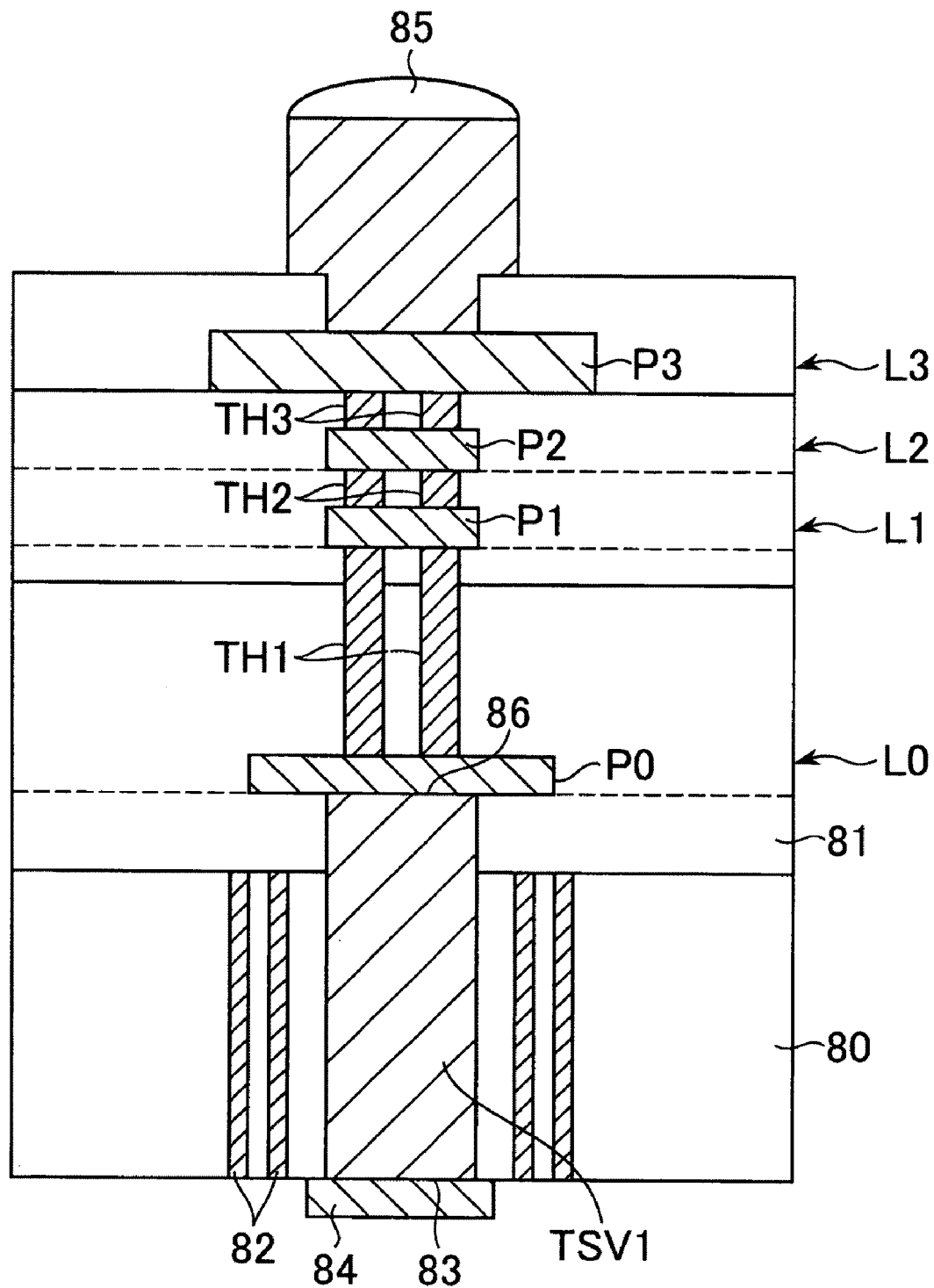
FIG. 3 is a cross-sectional view illustrating the structure of the TSV of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
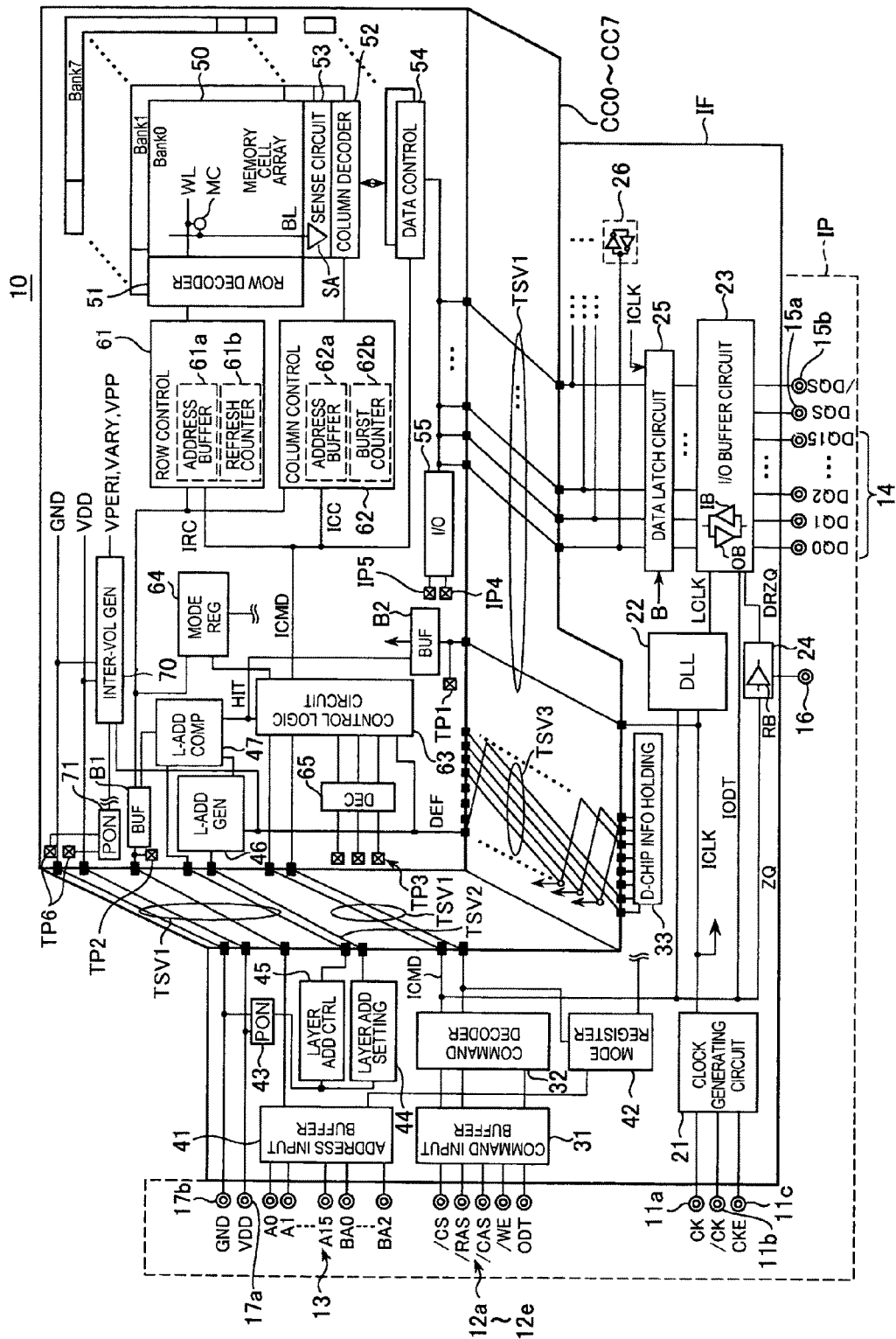
FIG. 4 is a block diagram illustrating the circuit configuration of the semiconductor device.

FIG. 4 is a block diagram illustrating the circuit configuration of the semiconductor device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

The logic-level holding circuit 26 is connected to each of the TSV1*s*. Although details are described later, the logic-level holding circuit 26 holds the logic level of the TSV1 when output buffers in the input/output circuit 55 of the core chips CC0 to CC7 are in a high impedance state and when an output buffer in the data latch circuit 25 of the interface chip IF is also in a high impedance state. With this configuration, it is possible to prevent a logic-level unstable state of the TSV1 and to prevent an occurrence of a through current.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor device 10 cannot be tested in case an assembly process of the interface chip and the plural core chips is not executed, and the interface chip is tested by testing the semiconductor device 10. In this case, when a defect that cannot be recovered exists in the interface chip, the entire semiconductor device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a non-used chip information holding circuit 33. When a defective core chip that does not normally operates is discovered after an assembly, the non-used chip information holding circuit 33 holds its chip number. The non-used chip information holding circuit 33 is connected to the core chips CC0 to CC7 through the TSVs. The non-used chip information holding circuit 33 is connected to the core chips CC0 to CC7 while being shifted, using the TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor device 10, each back can be independently accessed. For example, apart of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank can be controlled to be active. However, the external terminals (for example, plural control terminals and plural I/O terminals) of the semiconductor device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46.

In the layer address generating circuit (chip address generating circuit) 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a non-used chip signal DEF supplied from the non-used chip information holding circuit 33 of the interface chip IF, through the TSV. As the non-used chip signal DEF is supplied to the individual core chips CC0 to CC7 using the TSV3 of the type shown in FIG. 2C, the non-used chip signals DEF can be supplied to the core chips CC0 to CC7, individually. The non-used chip signal DEF is activated when the corresponding core chip is a defective chip. When the non-used chip signal DEF is activated, the layer address generating circuit 46 transmits, to the core chip of the lower layer, a non-incremented layer address, not an incremented layer address. The non-used chip signal DEF is also supplied to the layer address comparing circuit 47. When the non-used chip signal DEF is activated, the comparing result of the layer address is forced to be set unmatched. The output of the layer address comparing circuit 47 is also supplied to the control logic circuit 63. If a matched signal is not supplied, control logic circuit 63 is not activated. When the comparing result is not matched, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS.

The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied from the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor device 10 cannot be tested, before the interface chip and the plural core chips are fully assembled. In other words, the individual core chips are tested when testing the semiconductor device 10. When unrecoverable defect exists in the core chips, the entire semiconductor device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip selection signal /CS is input to one terminal (chip selection terminal), the semiconductor device is recognized as a single DRAM having the memory capacity of 8 Gb, in view of the controller.

The logic-level holding circuit mounted on the interface chip IF is explained next.

Figure 5:
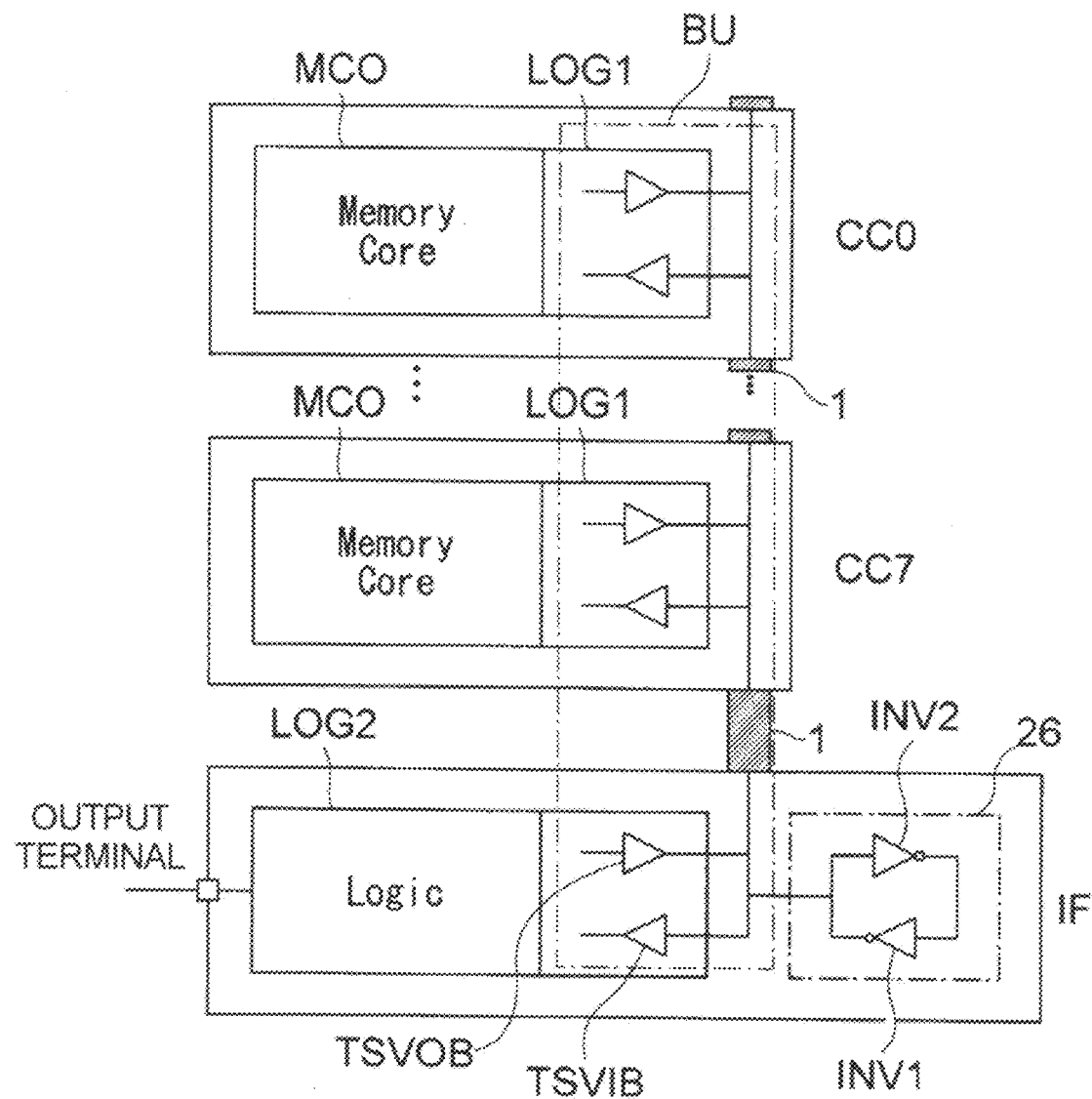
FIG. 5 is a schematic block diagram of a configuration of main parts of the semiconductor device 10.

FIG. 5 is a schematic block diagram of a configuration of main parts of the semiconductor device 10.

As shown in FIG. 5, the semiconductor device 10 includes the core chips CC0 to CC7 and the interface chip IF. These chips are stacked and connected by the TSV1. Each of the core chips CC0 to CC7 includes a memory core unit MCO that includes the memory cell array 50 and a logic unit LOG1 that controls the memory core unit MCO. The logic unit LOG1 is connected to the TSV1 via a bidirectional buffer circuit BU. The interface chip IF includes a logic unit LOG2 that controls the core chips CC0 to CC7, and the logic unit LOG2 is connected to the TSV1 via the bidirectional buffer circuit BU. Each bidirectional buffer circuit BU includes an input buffer TSVIB and an output buffer TSVOB, and at least the output buffer TSVOB is a tri-state buffer capable of setting an output in high impedance. The bidirectional buffer circuits BU of the core chips CC0 to CC7 are included in the input/output circuit 55 shown in FIG. 4. The bidirectional buffer circuit BU of the interface chip IF is included in the data latch circuit 25 shown in FIG. 4.

The interface circuit IF further includes the logic-level holding circuit 26. The logic-level holding circuit 26 is a latch circuit that includes cyclically connected first and second inverters INV1 and INV2.

In the present embodiment, the driving capability of the first inverter INV1 is set smaller than the driving capability of the output buffer TSVOB in the bidirectional buffer circuit BU. With this setting, the logic level of the TSV1 can be maintained without causing any negative influence on normal input/output operations performed by the bidirectional buffer circuit BU. Accordingly, when the output buffers TSVOB of all the bidirectional buffer circuits BU connected to the TSV1 are in high impedance, it is possible to prevent the TSV being in a logic unstable state and to prevent an occurrence of a through current.

Figure 6:
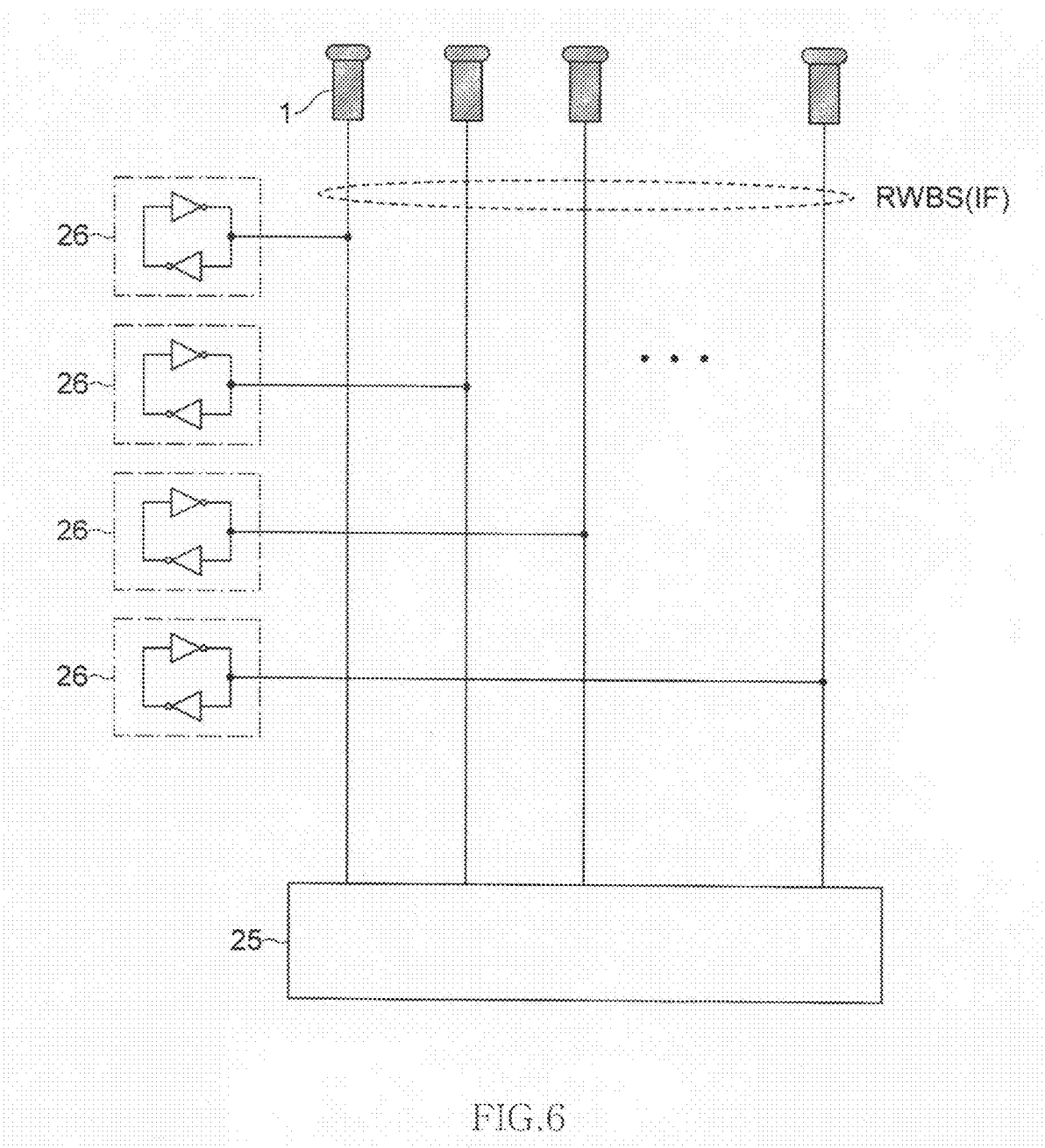
FIG. 6 is a schematic diagram for explaining a connection relationship between the TSV1 and the logic-level holding circuit.

FIG. 6 is a schematic diagram for explaining a connection relationship between the TSV1 and the logic-level holding circuit 26.

As shown in FIG. 6, the data latch circuit 25 of the interface chip IF is connected to the TSV1s via a read/write bus RWB, and one TSV1 and one logic-level holding circuit 26 are connected to one bus line. The TSV1 is driven by the bidirectional buffer circuit BU of the core chips or the interface chip connected to the TSV1, and can operate independently. Therefore, by preparing one logic-level holding circuit 26 for one TSV1, it is possible to securely prevent a logic-level unstable state of each of the TSV1s.

Figure 7A:
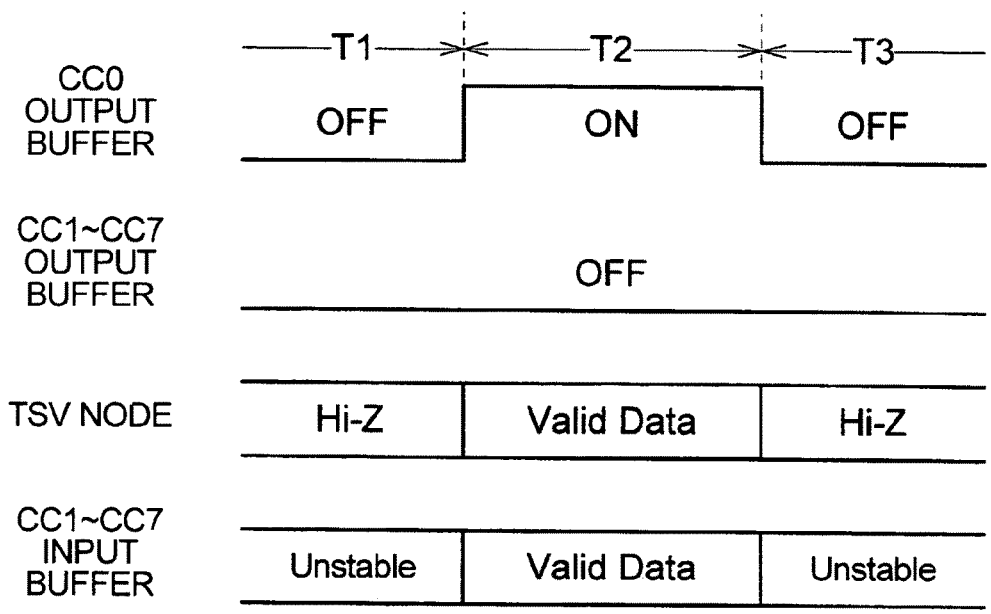
FIGS. 7A and 7B are timing charts of a comparison between an operation of the semiconductor device 10 according to the present embodiment (showing especially FIG. 7B) and an operation of a conventional semiconductor device (showing especially FIG. 7A)
Figure 7B:
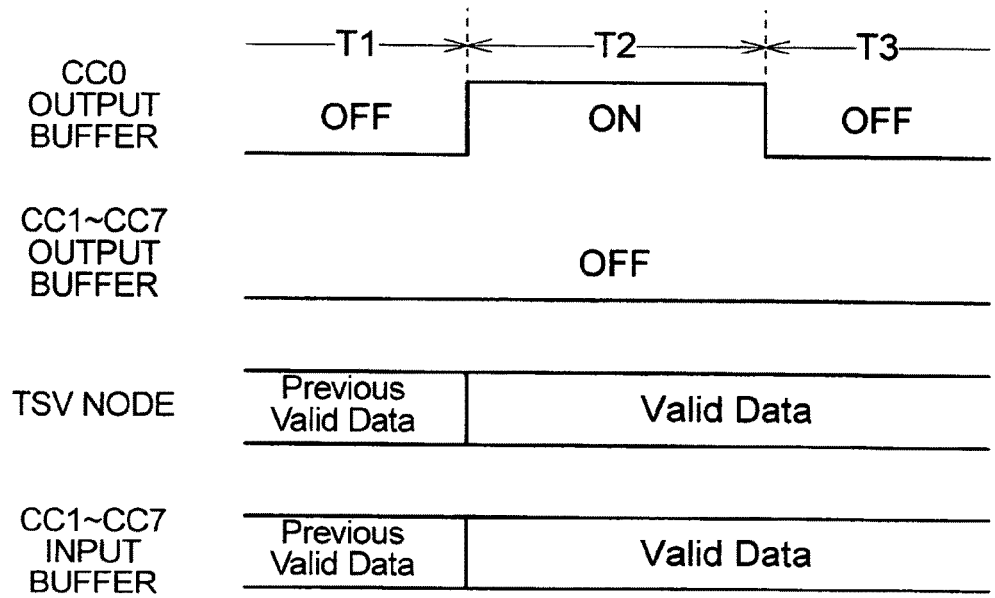

FIGS. 7A and 7B are timing charts of a comparison between an operation of the semiconductor device 10 according to the present embodiment and an operation of a conventional semiconductor device.

As shown in FIG. 7A, in a conventional semiconductor device, when a period T1 in which the output buffers TSVOB of all the core chips CC0 to CC7 become OFF (a high impedance state) at a time of a read operation, that is, when the bidirectional buffer circuits BU at core chip CC0 to CC7 sides are in an output mode, and also when the bidirectional buffer circuit BU at an interface chip IF side is in an input mode, the logic level of a TSV node (TSV1) is in an unstable state. Thus, a through current flows to the input buffers TSVIB of the interface chip IF and the core chips CC0 to CC7.

Thereafter, when the output buffer TSVOB of the core chip CC0 becomes ON (a period T2), the TSV node is driven at a high level or a low level, and thus a through current flowing to the input buffer TSVIB stops.

Thereafter, when the output buffer TSVOB of the core chip CC0 becomes OFF again (a period T3), the logic level of the TSV node (TSV1) is in an unstable state. Therefore, a through current again flows to the input buffer TSVIB.

On the other hand, as shown in FIG. 7B, in the semiconductor device 100 according to the present embodiment, even when the period T1 in which the output buffers TSVOB of all the core chips CC0 to CC7 become OFF occurs in a read operation, the logic level of the TSV node (TSV1) is maintained at an original logic level by the logic-level holding circuit 26. Therefore, a through current does not flow to the input buffers TSVIB of the interface chip IF and the core chips CC0 to CC7.

Thereafter, when the output buffer TSVOB of the core chip CC0 becomes ON (the period T2), the TSV node is driven at a high level or a low level by newly read data.

Thereafter, even when the output buffer TSVOB of the core chip CC0 becomes OFF again (the period T3), the logic level of the TSV node (TSV1) is maintained by the logic-level holding circuit 26. Therefore, a through current does not flow to the input buffer TSVIB.

As described above, because the logic-level holding circuit 26 according to the present embodiment can hold the logic level of the TSV1, a through current does not flow to the input buffer TSVIB even when all output buffers TSVOB are in a high impedance state. When the core chips CC are collectively manufactured as chips of the same configuration, the logic-level holding circuits 26 are connected to each of the TSVs by the number of the core chips and the load of each of the TSVs becomes large when the logic-level holding circuits 26 are arranged in the core chips CC. However, in the present embodiment, it suffices that one logic-level holding circuit 26 is arranged in each of the TSVs regardless of the number of core chips mounted on the semiconductor substrate 10, by arranging the logic-level holding circuit 26 in the interface chip IF not in the core chips CC. As a result, an increase in the load of each of the TSVs can be suppressed even when core chips of the same configuration are stacked.

Figure 8:
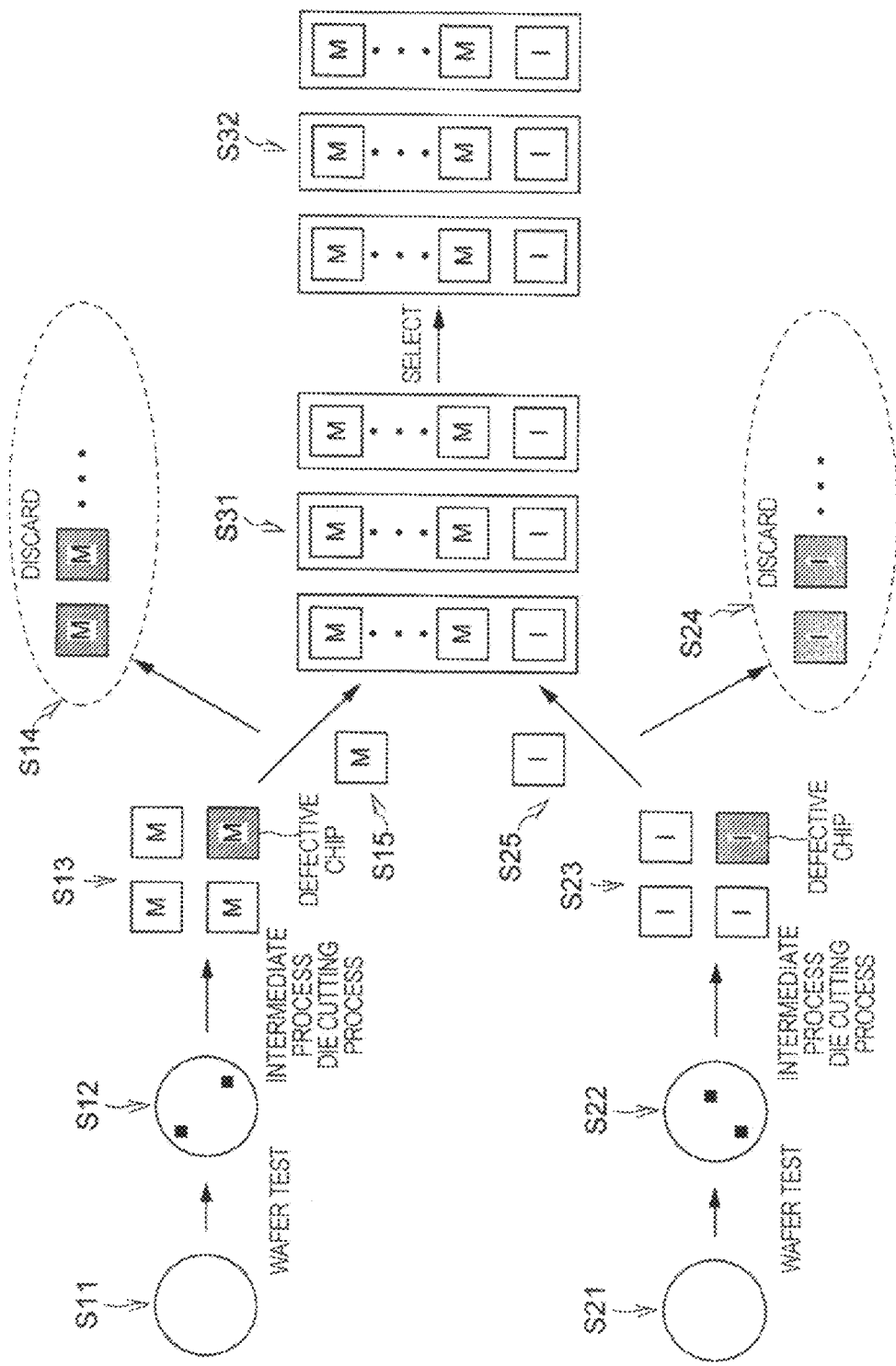
FIG. 8 is a schematic diagram showing a manufacturing process of the semiconductor device.

FIG. 8 is a schematic diagram showing a manufacturing process of the semiconductor device 10.

As shown in FIG. 8, when the semiconductor device 10 according to the present embodiment is manufactured, plural core chips and an interface chip are manufactured first. These chips are then stacked, thereby completing the semiconductor device 10.

When core chips are manufactured, circuits for core chips are formed first on a wafer for core chips (S11), a wafer test is then performed and positions of defective chips on the wafer are mapped (S12). Plural core chips are then completed after an intermediate process and a die cutting process (S13). Chips determined as defective at the wafer test are removed among the core chips (S14), and only good chips are sent to an assembly process (S15).

When interface chips are manufactured, circuits for interface chips are first formed on a wafer for interface chips (S21), a wafer test is then performed and positions of defective chips on the wafer are mapped (S22). At this time, the logic-level holding circuit 26 in the interface chip is used as a pseudo memory, and a data read/write test is performed, thereby testing the interface chip in a state of a semiconductor wafer. Plural interface chips are then completed after an intermediate process and a die cutting process (S23). Further, chips determined as defective at the wafer test are removed among the interface chips (S24), and only good chips are sent to an assembly process (S25).

Figure 9:
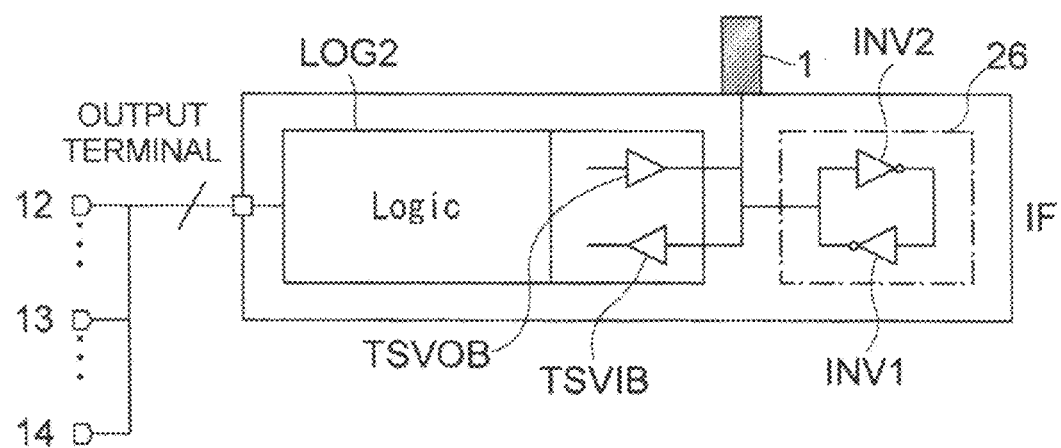
FIG. 9 is a schematic block diagram to explain an operation of an interface chip IF alone.

At a test of a wafer for interface chips, as shown in FIG. 9, a predetermined command is input to the command terminal 12 of the interface chip IF, a predetermined address signal is input to the address terminal 13, and predetermined test data is input to the data input/output terminal 14. Accordingly, test data is written into the logic-level holding circuit 26 connected to the TSV1 for data transmission designated by the address signal. Thereafter, test data held in the logic-level holding circuit 26 is read via a data input/output system circuit of the input/output buffer circuit 23 and the data input/output terminal 14, and is compared with input test data. When input/output data match, the chip can be determined as a good chip, and when input/output data do not match, the chip can be determined as a defective chip.

In the assembly process, the core chips CC0 to CC7 and the interface chip IF are stacked to manufacture the semiconductor device 10 (S31), a final operation confirmation is then performed, and the semiconductor device 10 as a defective product is selected (S32). The semiconductor device 10 according to the present embodiment is completed in this manner.

Because any memory element is not present on the interface chip, in a conventional semiconductor device not having the logic-level holding circuit 26, a data read/write test cannot be performed with respect to the interface chip alone (including a wafer state). Therefore, a defective interface chip cannot be specified before combining an interface chip and core chips. However, according to the present embodiment, an interface chip is tested at a wafer stage by using the logic-level holding circuit 26 as a pseudo memory. Only interface chips determined as good products are sent to the assembly process. Therefore, the probability that an interface chip is found as defective after an assembly process is very small, and the manufacture yield of chip-stacked semiconductor devices can be greatly improved.

Figure 10:
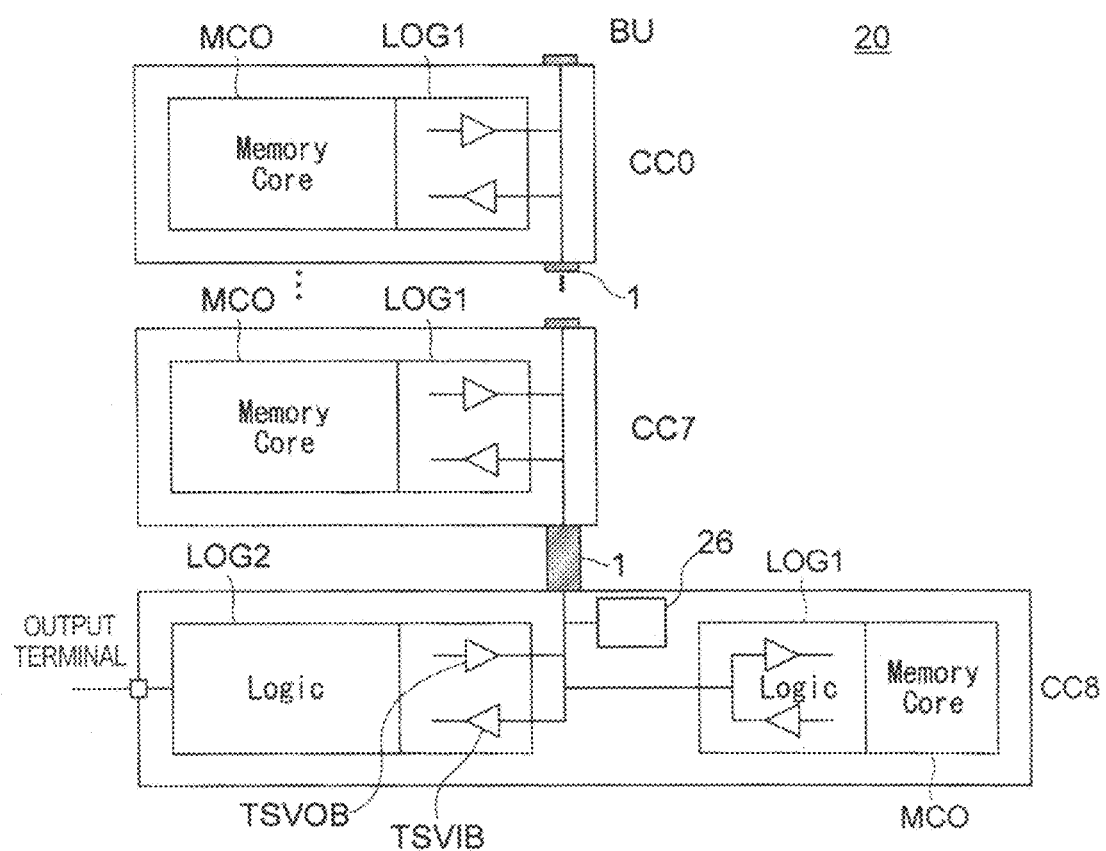
FIG. 10 is a schematic block diagram showing main parts of a semiconductor device 20 according to another embodiment of the present invention.

FIG. 10 is a schematic block diagram showing main parts of a semiconductor device 20 according to another embodiment of the present invention.

As shown in FIG. 10, a main feature of the semiconductor device 20 is that the core chip CC8 also functions as the interface chip IF. Each of the core chips CC0 to CC8 includes the memory core unit MCO that includes the memory cell array 50 and the logic unit LOG1 that controls the memory core unit MCO. The logic unit LOG1 is connected to the TSV1 via the bidirectional buffer circuit BU. Further, the core chip CC8 includes the logic unit LOG2, and the logic units LOG1 and LOG2 are connected to the TSV1 via the bidirectional buffer circuit BU. Other configurations of the semiconductor device 20 are substantially the same as those of the semiconductor device 10 shown in FIG. 5, and therefore like reference numerals are denoted to like constituent elements, and detailed explanations thereof will be omitted.

The semiconductor device 20 according to the present embodiment can also achieve effects identical to those of the semiconductor device 10.

Figure 11:
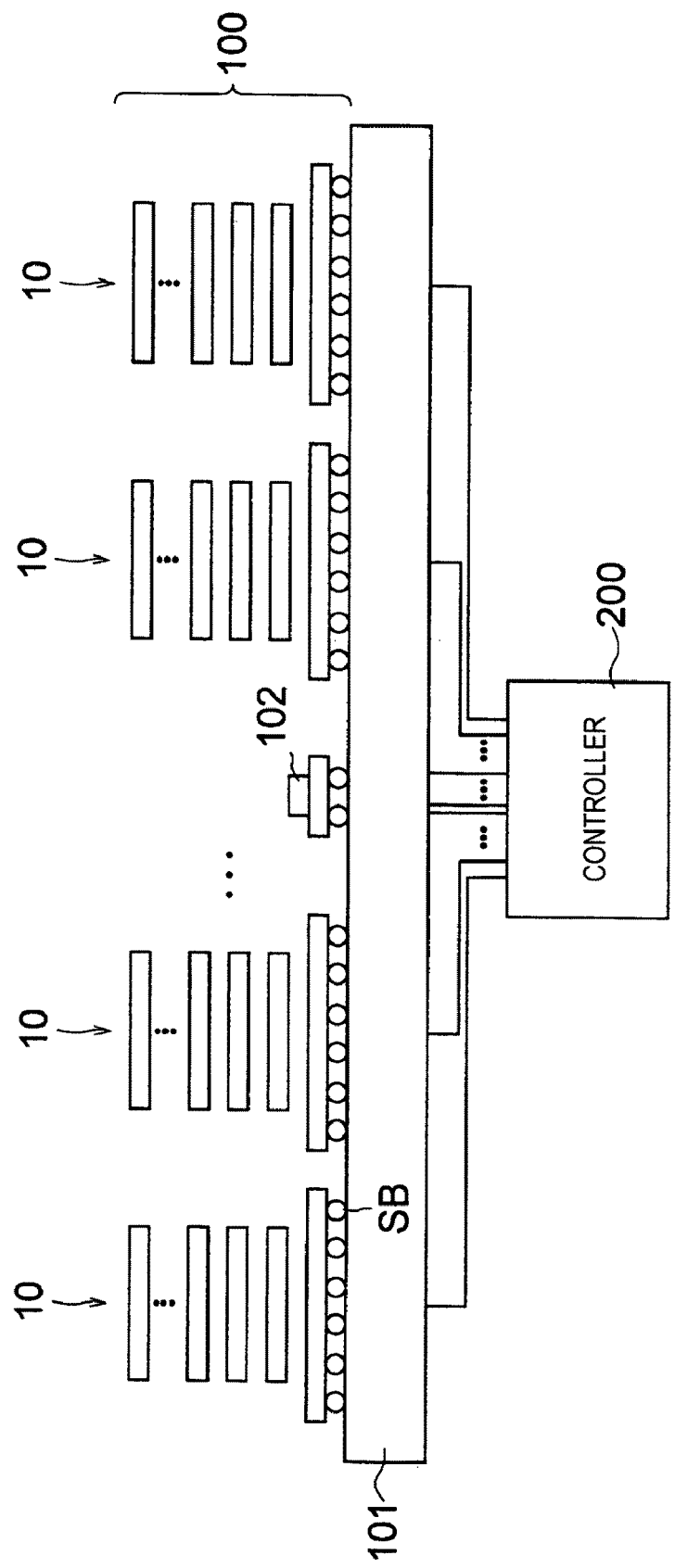
FIG. 11 is a schematic diagram showing the configuration of a data processing system using the semiconductor device.

FIG. 11 is a schematic diagram showing the configuration of a data processing system using the semiconductor device 10 according to this embodiment. It will be obvious that the semiconductor device 20 can be used in the data processing system.

The data processing system shown in FIG. 11 includes a memory module 100 and a controller 200 connected to the memory module 100. In the memory module 100, the plural semiconductor devices 10 are mounted on a module substrate 101. A register 102 that receives an address signal or a command signal supplied from the controller 200 is mounted on the module substrate 101, and the address signal or the command signal is supplied to each semiconductor device 10 through the register 102.

In the data processing system that has the above configuration, the controller 200 may supply only various signals, such as the address signals or the command signals, which are needed for an access of a common DRAM, and does not need to supply a special signal, such as a chip selection address, which is not used in the common DRAM.

It is apparent that the present invention is not limited to the above embodiments, but may be modified and changed without departing from the scope and spirit of the invention.

For example, in the embodiment, the DDR3-type SDRAMs are used as the plural core chips having the same function. However, the present invention is not limited thereto. Accordingly, the core chip may be a DRAM other than the DDR3-type and a semiconductor memory (SRAM (Static Random Access Memory), PRAM (Phase-change Random Access Memory), MRAM (Magnetic Random Access Memory) or a flash memory) other than the DRAM. The core chips may be plural semiconductor chips that have functions other than the functions of the semiconductor memory, which are equal to or different from each other. That is, the core chips may be semiconductor devices, such as a CPU (Central Processing Unit), an MCU (Micro Control Unit), a DSP (Digital Signal Processor), an ASIC (Application Specific Integrated Circuit), and an ASSP (Application Specific Standard Circuit). All of the core chips do not need to be laminated and all or part of the core chips may be two-dimensionally disposed. The number of core chips is not restricted to 8.

Furthermore, the present invention can be also applied to semiconductor devices other than semiconductor memories. For example, it is possible that a CPU (Central Processing Unit) is mounted on an interface chip, a cache memory of the CPU is mounted on a core chip, and the interface chip and plural core chips are combined to constitute a high-performance CPU. Further, it is also possible that a CPU, a GPU (Graphics Processing Unit) SDRAM, and a flash memory are prepared as core chips, chip sets of these core chips are prepared as interface chips, and these are constituted as a chip-stacked semiconductor device, thereby realizing a one-chip computer.

What is claimed is:

1. A semiconductor device comprising:
a first semiconductor chip including a first electrode and a first input circuit that comprises an input node coupled to the first electrode; and
a second semiconductor chip including a first output terminal coupled to the first electrode of the first semiconductor chip and a first output circuit that comprises an output node coupled to the first output terminal, the first output circuit driving, when activated, the first electrode of the first semiconductor chip to one of first and second logic levels and rendering, when deactivated, the output node thereof a high impedance, the second semiconductor chip further including a first holding circuit provided independently of the first output circuit, and coupled to the first output terminal to drive the first electrode of the first semiconductor chip to one of the first and second logic levels at least when the first output circuit is deactivated.

2. The semiconductor device as claimed in claim 1, wherein the first semiconductor chip further includes a second output circuit including an output node coupled to the first electrode and driving, when activated, the first electrode to one of the first and second logic levels.

3. The semiconductor device as claimed in claim 2, wherein one of the first and second output circuits is activated during a first period of time so as to drive the first electrode of the first semiconductor chip from one of the first and second logic levels to the other of the first and second logic levels and deactivated during a second period of time following the first period of time, and the first holding circuit holds the logic level of the first electrode at the other of the first and second logic levels at least during the second period of time.

4. The semiconductor device as claimed in claim 3, wherein the first holding circuit holds the first electrode of the first semiconductor chip at the one of the first and second logic level during a third period of time followed by the first period of time.

5. The semiconductor device as claimed in claim 1, wherein the first output circuit is activated during a first period of time so as to drive the first electrode of the first semiconductor chip from one of the first and second logic levels to the other of the first and second logic levels and deactivated during a second period of time following the first period of time, and the first holding circuit holds the logic level of the first electrode at the other of the first and second logic levels at least during the second period of time.

6. The semiconductor device as claimed in claim 5, wherein the first holding circuit holds the first electrode of the first semiconductor chip at the one of the first and second logic level during a third period of time followed by the first period of time.

7. The semiconductor device as claimed in claim 1, wherein the first holding circuit is smaller in driving capacity for the first electrode of the first semiconductor chip than the first output circuit.

8. The semiconductor device as claimed in claim 1, wherein:
the first semiconductor chip further includes a first memory cell array,
the second semiconductor chip further includes a plurality of logic circuits without including any memory cell array, and
the logic circuits of the second semiconductor chip control the memory cell array of the first semiconductor chip.

9. The semiconductor device as claimed in claim 1, wherein the first semiconductor chip and the second semiconductor chip are stacked with each other.

10. The semiconductor device as claimed in claim 1, wherein the first holding circuit includes first and second inverters, an output node of the first inverter is coupled to an input node of the second inverter, and an input node of the first inverter and an output node of the second inverter are coupled in common to the first output terminal of the second semiconductor chip.

11. The semiconductor device as claimed in claim 1, wherein the second semiconductor chip includes a second input circuit comprising an input node coupled to the first output terminal of the second semiconductor chip.

12. The semiconductor device as claimed in claim 1, wherein the first semiconductor chip includes a first penetration electrode coupled to the first electrode thereof.

13. An information processing system comprising:
a semiconductor device having a plurality of core chips and an interface chip that controls the core chips; and
a controller that controls the semiconductor device, wherein
each of the core chips includes a through silicon via that penetrate a substrate and a tri-state buffer having an output terminal connected to the through silicon via, and the silicon vias of the core chips are coupled to each other, and
the interface chip includes an input buffer having an input terminal connected to the through silicon via of one of the core chips and a logic-level holding circuit that holds a logic level of the through silicon vias.

14. A device comprising:
a first through silicon via;

a first semiconductor chip comprising:
- a memory cell array configured to store first data; and
- a first output buffer driving, when activated, the first through silicon via to one of first and second logic levels in response to the first data to transfer the first data to the first through silicon via, the first output buffer being, when deactivated, free from driving the first through silicon via; and a second semiconductor chip, stacked with the first semiconductor chip, the second semiconductor chip comprising:
- a first input buffer coupled to the first through silicon via to receive the first data supplied from the first semiconductor chip thorough the first through silicon via; and
- a first level holding circuit coupled to the first through silicon via in common with the first input buffer, the first level holding circuit being configured to store the first data and driving the first through silicon via to the one of first and second logic levels in response to the first data during a period of time when the first output buffer of the first semiconductor chip is deactivated.

15. The device as claimed in claim, 14, wherein the first level holding circuit of the second semiconductor chip is configured to drive the first through silicon via with a driving capacity that is smaller than that of the first output buffer of the first semiconductor chip.

16. The device as claimed in claim 14, wherein the first level holding circuit of the second semiconductor chip includes first and second inverter circuits each having input and output nodes, the output node of the first inverter circuit is coupled to the input node of the second inverter circuit, and the input node of the first inverter circuit and the output node of the second inverter circuit are coupled in common to the first through silicon via.

17. The device as claimed in claim 14, further comprising a plurality of second through silicon vias, and wherein the memory cell array of the first semiconductor chip is configured to store a plurality of second data, the first semiconductor chip further comprises:
- a plurality of second output buffers each coupled to a corresponding one of the second through silicon vias, each of the second output buffers driving, when activated, the corresponding one of the second through silicon vias to one of third and fourth logic levels in response to an associated one of the second data to transfer the associated one of the second data to the corresponding one of the second through silicon vias, each of the second output buffers being, when deactivated, free from driving the corresponding one of the second through silicon vias, and the second semiconductor chip further comprises:
- a plurality of second level holding circuits each coupled to a corresponding one of the second through silicon vias, each of the second level holding circuits being configured to store an associated one of the second data and driving a corresponding one of the second through silicon vias to the one of third and fourth logic levels in response to the associated one of the second data during a period of time when a corresponding one of the second output buffers of the first semiconductor chip is deactivated.

18. The device as claimed in claim 17, wherein each of the second level holding circuits of the second semiconductor chip is configured to drive the corresponding one of the second through silicon vias with a driving capacity that is smaller than that of one of the second output buffers coupled to the corresponding one of the second through silicon vias.

19. The device as claimed in claim 17, wherein the second semiconductor chip further comprises:
- a plurality of second input buffers coupled to a corresponding one of the second through silicon vias; and
- a data latch circuit unit including the first and the second input buffers, the data latch circuit unit including a first unit receiving in parallel the first and the second data and outputting in series the first and the second data.

20. The device as claimed in claim 14, further comprising a second through silicon via receiving second data, wherein the second semiconductor chip further comprises:
- a second output buffer including an input node coupled to the second through silicon via and an output node coupled to the first through silicon via in common with the first input buffer and the first level holding circuit, the second output buffer driving, when activated, the first through silicon via to one of the first and the second logic levels in response to the second data to transfer the second data to the first semiconductor chip, and
- the memory cell array of the first semiconductor chip is configured to store the second data.

* * * * *